United States Patent [19]

Takeda et al.

[11] Patent Number: 4,992,954

[45] Date of Patent: Feb. 12, 1991

[54] METHOD OF STORING CHARACTER PATTERNS AND CHARACTER PATTERN UTILIZATION SYSTEM

[75] Inventors: Haruo Takeda, Kawasaki; Minoru Fukasawa, Yuuki, both of Japan

[73] Assignee: Hitachi, Ltd., Tokyo, Japan

[21] Appl. No.: 227,718

[22] Filed: Aug. 3, 1988

[30] Foreign Application Priority Data

Aug. 5, 1987 [JP] Japan .................................. 62-194471
Jan. 20, 1988 [JP] Japan .................................... 63-8312

[51] Int. Cl.$^5$ .......................................... H03M 11/00
[52] U.S. Cl. ..................................... 364/518; 341/65; 341/67
[58] Field of Search ................ 364/518, 519; 340/735, 340/790; 341/65, 67; 358/260

[56] References Cited

U.S. PATENT DOCUMENTS

| | | | |
|---|---|---|---|
| 4,207,599 | 6/1980 | Murayama et al. | 341/67 X |
| 4,439,761 | 3/1984 | Fleming et al. | 340/735 |
| 4,646,061 | 2/1987 | Bledsoe | 341/65 |
| 4,700,175 | 10/1987 | Bledsoe | 341/65 |
| 4,745,561 | 5/1988 | Hirosawa et al. | 340/735 X |
| 4,819,079 | 4/1989 | Takao | 358/260 |

Primary Examiner—Gary V. Harkcom
Assistant Examiner—Mark K. Zimmerman
Attorney, Agent, or Firm—Fay, Sharpe, Beall, Fagan, Minnich & McKee

[57] ABSTRACT

In a character pattern utilization system provided with a plurality of character patterns differing in size or style from one another for each of a plurality of characters which are associated with corresponding character codes, the character patterns of each type are compression-coded beforehand using one of a plurality of code tables which corresponds to the character types. Upon designation of a code and a pattern type for a character to be outputted, the compression-coded character pattern corresponding to it is restored using the code table corresponding to said pattern type and is outputted.

9 Claims, 12 Drawing Sheets

FIG. 2A
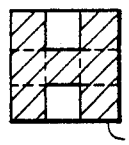
31
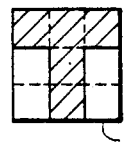
32
FIG. 2B
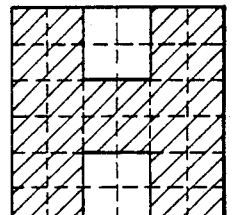
33
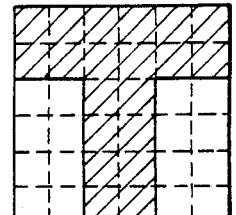
34
FIG. 3A
| RUN | B | W |
|---|---|---|
| 1 | 4 | 2 |
| 2 | 0 | 0 |
| 3 | 1 | 0 |
| 4 | 0 | 0 |
| 5 | 0 | 0 |
| 6 | 0 | 0 |
41
FIG. 3B
| RUN | B | W |
|---|---|---|
| 1 | 2 | 4 |
| 2 | 0 | 0 |
| 3 | 1 | 0 |
| 4 | 0 | 0 |
| 5 | 0 | 0 |
| 6 | 0 | 0 |
42
FIG. 3C
| RUN | B | W |
|---|---|---|
| 1 | 0 | 0 |
| 2 | 8 | 4 |
| 3 | 0 | 0 |
| 4 | 0 | 0 |
| 5 | 0 | 0 |
| 6 | 2 | 0 |
43
FIG. 3D
| RUN | B | W |
|---|---|---|
| 1 | 0 | 0 |
| 2 | 4 | 8 |
| 3 | 0 | 0 |
| 4 | 0 | 0 |
| 5 | 0 | 0 |
| 6 | 2 | 0 |
44
FIG. 4A
| RUN | BLACK | WHITE |
|---|---|---|
| 1 | 6 | 6 |
| 2 | 12 | 12 |
| 3 | 2 | 0 |
| 4 | 0 | 0 |
| 5 | 0 | 0 |
| 6 | 4 | 0 |
45
FIG. 4B
| RUN | BLACK | WHITE |
|---|---|---|
| 1 | 6 | 6 |
| 2 | 0 | 0 |
| 3 | 2 | 0 |
| 4 | 0 | 0 |
| 5 | 0 | 0 |
| 6 | 0 | 0 |
46
FIG. 4C
| RUN | BLACK | WHITE |
|---|---|---|
| 1 | 0 | 0 |
| 2 | 12 | 12 |
| 3 | 0 | 0 |
| 4 | 0 | 0 |
| 5 | 0 | 0 |
| 6 | 4 | 0 |
47

| RUN | BLACK | WHITE |
|-----|-------|-------|
| 1 | 01 | 01 |
| 2 | 1 | 1 |
| 3 | 0001 | 0000 |
| 4 | 00000 | 0001 |
| 5 | 00001 | 0010 |
| 6 | 001 | 0011 |

51

| RUN | BLACK | WHITE |
|-----|-------|-------|
| 1 | 1 | 1 |
| 2 | 0000 | 0000 |
| 3 | 01 | 0001 |
| 4 | 0001 | 0100 |
| 5 | 0010 | 0101 |
| 6 | 0011 | 011 |

52

| RUN | BLACK | WHITE |
|-----|-------|-------|
| 1 | 0000 | 000 |
| 2 | 1 | 1 |
| 3 | 0001 | 001 |
| 4 | 0010 | 0100 |
| 5 | 0011 | 0101 |
| 6 | 01 | 011 |

53

| RUN | BLACK | WHITE |
|-----|-------|-------|
| 0 | 0 | 12 |
| 1 | 4 | 2 |
| 2 | 10 | 8 |
| 3 | 0 | 2 |
| 4 | 0 | 6 |
| 5 | 0 | 0 |
| 6 | 6 | 0 |

48

| RUN | BLACK | WHITE |
|-----|-------|-------|
| 0 | 00000 | 1 |
| 1 | 001 | 0001 |
| 2 | 1 | 01 |
| 3 | 00001 | 00001 |
| 4 | 00010 | 001 |
| 5 | 00011 | 000001 |
| 6 | 01 | 000000 |

| 111111 | 111111 | 001100 | 001100 | 001100 | 001100 | —P34 |

| 110000 | 110000 | 110000 | 110000 | 111111 | 111111 | —P35 |

| 111111 | 100001 | 000110 | 011000 | 100001 | 111111 | —P36 |

FIG. 15

| RUN | BLACK | WHITE |
|---|---|---|
| 0 | 0 | 12 |
| 1 | 14 | 12 |
| 2 | 10 | 8 |
| 3 | 0 | 12 |
| 4 | 0 | 6 |
| 5 | 0 | 0 |
| 6 | 0 | 0 |

| RUN | BLACK | WHITE |
|---|---|---|
| 0 | 000000 | 11 |
| 1 | 1 | 01 |
| 2 | 01 | 101 |
| 3 | 00001 | 00 |
| 4 | 00010 | 1001 |
| 5 | 00011 | 10001 |
| 6 | 001 | 10000 |

| CHARAC-TER TYPE | PATTERN LENGTH | DATA FILE ADDRESS | CODE TABLE ADDRESS |
|---|---|---|---|
| 1 | $\ell_1$ | $S_1$ | $T_1$ |
| 2 | $\ell_2$ | $S_2$ | $T_2$ |
| ⋮ | ⋮ | ⋮ | ⋮ |
| n | $\ell_n$ | $S_n$ | $T_n$ |
| 81 | 82 | 83 | 84 |

METHOD OF STORING CHARACTER PATTERNS AND CHARACTER PATTERN UTILIZATION SYSTEM

BACKGROUND OF THE INVENTION (1) Field of the Invention

The present invention relates in general to a method of storing character patterns and a system for utilizing the character patterns, and in particular to a character utilization system holding therein several types of character patterns differing in size or in style from one another for editing or printing a document with fine characters as well as to a character pattern storing method suitable for such system.

(2) Description of the Prior Art

"Word processor" has long been enumerated as a fundamental office-automation apparatus. In recent years, attention has been given to a new document processing system called "interoffice printing system" or "desktop publishing system." As to such system, see, for example, "Nikkei Computer", published by Nikkei McGraw-Hill, pp. 147-152, Aug. 18, 1986.

The major feature of such document creating system is its ability of printing, with a high resolution, in a number of character patterns of a greatly increased number of sizes and styles as compared to prior art word processors in which the available sizes or styles of the character patterns are limited to one or so in number.

To implement this kind of system, however, there is a problem of how to hold various character patterns. That is, high resolution character patterns are required for a high resolution printer; and, to hold thousands or more character patterns for each size and style, a file of great capacity is required For example, where a laser printer having a linear density of 16 lines/mm is to be used, approximately a 3M byte storage capacity is required to hold seven thousand characters (JIS first and second levels) of 10 points (3 mm × 3 mm). Thus, to hold those characters in each of five different sizes and two different styles, Ming and Gothic, a storage capacity of about 30M bytes is required. To hold character patterns of about 40 points, if only in a single style, a storage capacity of more than 40M bytes is required.

In prior art systems, as described in the above-noted publication, the character patterns are usually stored in a storage device such as a magnetic disk, and there is a problem in that a large capacity storage device is required to be devoted to the character patterns.

SUMMARY OF THE INVENTION

An object of the present invention is to provide a character pattern utilization system capable of storing a great number of character patterns in a memory of relatively small storage capacity.

Another object of the present invention is to provide a method of storing character patterns which allows for a reduction of the storage capacity required for holding the character patterns and which also allows for easy management of the character pattern data.

To achieve the above-described objects, the character pattern utilization system according to the present invention, which is provided with a plurality of different types of character patterns differing in size or style for each of a plurality of characters associated with character codes, is characterized in that each of said character patterns is compressed beforehand into a code using one of a plurality of code tables which corresponds to the type of such character pattern to be compressed. The thus obtained codes are then stored, and upon designation of the code of a character to be outputted and pattern type therefore, the corresponding character pattern is restored from a corresponding one of said compressed codes using the code table which corresponds to said pattern type, and the thus restored character pattern is outputted.

A character pattern is one, in which some fixed patterns of contiguous dots may repetitively occur, since, for example, character patterns of a particular size and style may have standard line thicknesses which are peculiar to the particular size and style, and identical line configurations may continuously exist. In other words, since character patterns of a particular type may have features peculiar to the type, use of compression codes suitable for them will allow for encoding them into compressed codes of reduced data amount. For example, it is possible to achieve a high compressibility for each character pattern by assigning shorter codes to the run lengths corresponding to said standard line widths, using the one-dimensional run codes described in Takatiko Fukinuke, "Signal Processing for Images for FAX and OA," Nikkan Kogyo Shinbunsha, pp. 67-75.

In accordance with the present invention, since a particular code table, which may vary from one character pattern type to another, is used for a corresponding character pattern type, in order to optimally compress the character patterns of the particular type it is possible to greatly reduce the storage capacity required for the character patterns relative to the prior art.

The pattern data obtained by simply encoding character patterns by means of said code tables may have different lengths for different characters. Thus, the management table which is to be consulted for reading data from compressed character pattern files becomes complex.

To facilitate the reading of compressed character pattern data, the method of holding character patterns according to the preener invention is characterized in that after the compressing of the character patterns, all of the data obtained by the compression are adjusted to a fixed record length which is determined by the maximum compressed data length and then the fixed record length data is stored.

Holding data of a fixed record length is achieved, for example, in the following manner: Initially, for a group of character patterns of a particular size and style, a suitable code table is prepared. Next, by the use of such a code table, the character patterns are encoded into compressed data and the maximum length of this data is determined. Then, each compressed data which has been adjusted to a fixed record length equal to the maximum length, is stored. Then, each data shorter than the record length is given fill bits to expand it to the fixed record length. When particular compressed data corresponding to particular character patterns are too large, the record length can be shortened by renewing the code table in such a manner that the data for said particular character patterns become shorter.

The foregoing and other objects, advantages, manner of operation, and novel features of the present invention will be understood from the following detailed description when read in connection with the accompanying drawings.

BRIEF DESCRIPTION OF THE DRAWINGS

FIGS. 2A and 2B are graphs showing character patterns of different sizes (types);

FIGS. 3A-3D show tables illustrating run length frequency distributions respectively corresponding to the character patterns 31-34 shown in FIGS. 2A-2B;

FIG. 4A-4C show tables illustrating the features found in the run length frequency distributions of the different character types;

FIG. 14 is an illustration of original character patterns;

FIG. 15 shows a run length frequency distribution table which has been modified for adjusting data lengths;

FIG. 16 shows an exemplary code table prepared on the basis of the frequency distribution shown in FIG. 15;

FIG. 22 shows an embodiment of the address management table used in the system of FIG. 21.

DESCRIPTION OF THE PREFERRED EMBODIMENTS

Figure 1:
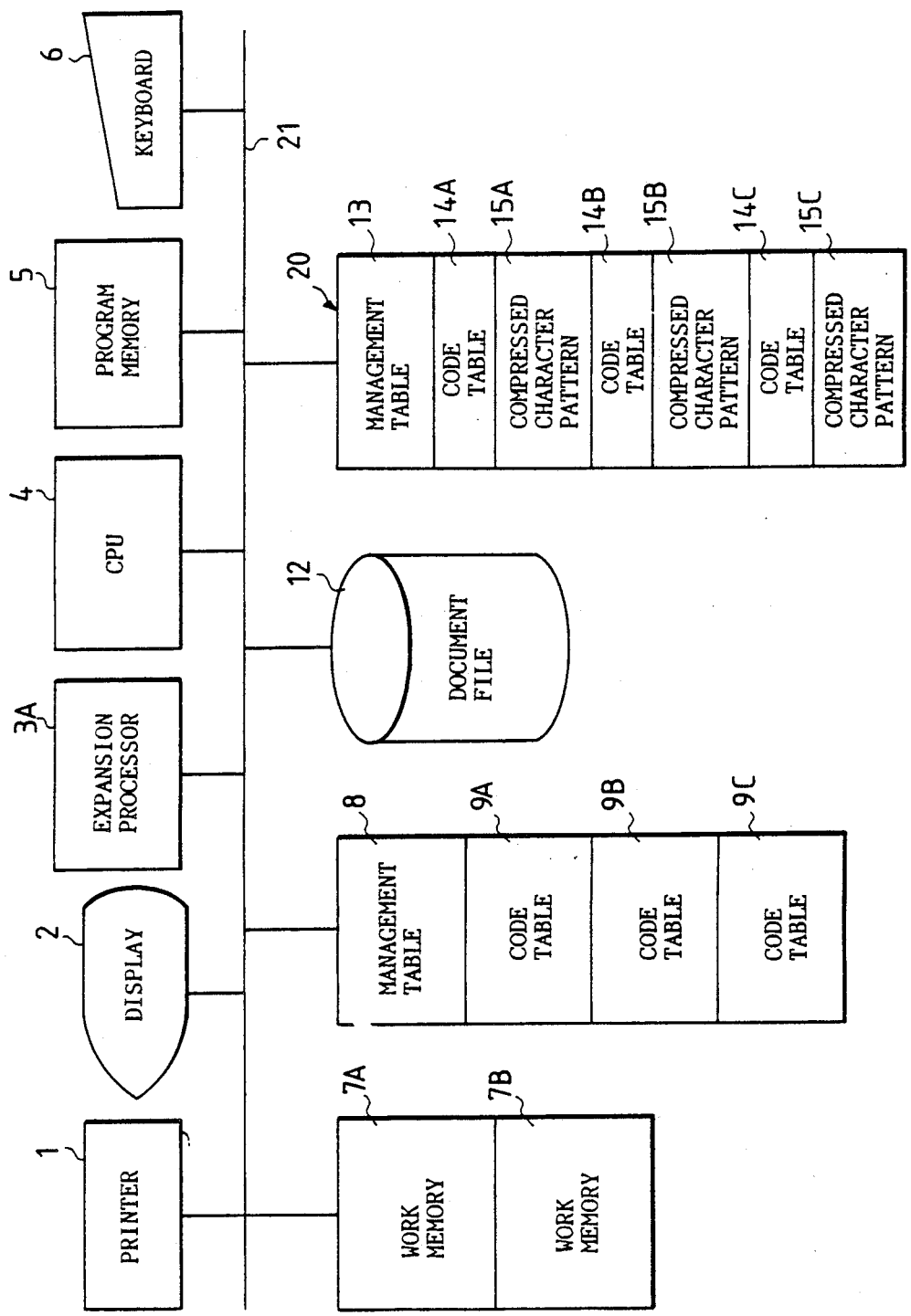
FIG. 1 is a block diagram showing the construction of a document processing system which is a first embodiment of the present invention.

FIG. 1 is a block diagram showing an example of the document processing system according to the present invention. The system is comprised of a printer 1 for printing document data, a bit map display 2 for displaying document data, a spreading (or expansion) processor 3A for restoring compression-coded character patterns, a data processor 4 operating in accordance with programs stored therein, a memory 5 for storing therein the programs to be performed by the data processor 4, a keyboard 6 for entering e.g. commands, memories 7A and 7B for storing therein document data, memories 8 and 9A-9C for storing therein tables related to character patterns, a document file 12 for document data, character pattern file 20 divided into several regions 13-15C for storing therein compressed character patterns, and a bus 21 connecting them together.

Firstly, the construction of the compressed character pattern file 20 will be described. In accordance with the present invention, compression-coded character pattern data is stored in the file. As an example of the method of the compression, the one-dimensional run code method described in the above-mentioned publication by Fukinuke will here be explained.

For example, FIG. 2A shows character patterns 31 and 32 having a size of 3×3 picture elements, and FIG. 2B shows character patterns 33 and 34 having a size of 6×6 picture elements. Although very simple character patterns are shown for making the description easier, the present invention is also applicable to character patterns consisting of much more picture elements.

In accordance with the above-noted data compressing method, run lengths are encoded with reference to a code table. Here, the term "run length" means the number of a series of contiguous picture elements of the same color, either black or white, found by scanning each row of the picture elements of a character pattern from, for example, the leftmost picture element. For example, the run lengths found in the pattern 31 are: in the first or the uppermost row, black picture element 1, white 1, and black 1; in the second row, black 3; in the third row, black 1, white 1, and black 1.

FIGS. 3A-3D show tables of run length frequency distributions of the character patterns. The table 41 shows the run length frequency distribution of the pattern 31, in which there are four runs of 1 black picture element, two runs of "1" white picture element, and one run of "3" black continuous picture elements. Likewise, the tables 42-44 show the run length frequency distributions of the patterns 32-34, respectively.

The table 45 of FIG. 4A shows the frequency distribution derived by adding together the data of the tables 41-45; the table 46 of FIG. 4B shows the frequency distribution derived by adding together the data of the tables 41 and 42 related to the character patterns having the size of 3×3 picture elements; the table 47 of FIG. 4C shows the frequency distribution derived by adding together the data of the tables 43 and 44 related to the character patterns of the size of 6×6 picture elements.

As will be understood from those tables, run length frequencies have significant features which arise from the typical line thicknesses. Specifically, in the tables 41 and 42 the frequencies have peaks at runs of "1" black picture element and "1" white picture element, and in the sum of these tables, at black 1 and white 1, and in the sum of these tables, i.e. in the table 46, such features are still held. Also, in the tables 43 and 44 peaks are found at runs of "2" black picture elements and "2" white picture elements, and such features are still held in the sum of these tables, i.e. in the table 47. The above-mentioned features, however, are not clear in the table 45 which is the sum of the tables 41-44. As will be understood from the foregoing, higher compressibility can be achieved by assigning a set of adapted compression codes to a corresponding set of character patterns of a size and style having common typical line thicknesses, than by assigning a set of compression codes to character patterns including different typical line thicknesses.

Figures 5A, 5B, 5C, 6, 7, 8:
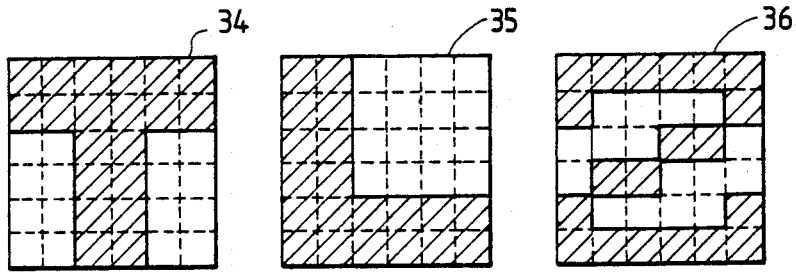
FIGS. 5A-5C show exemplary code tables prepared on the basis of the run length frequency distributions shown in FIGS. 4A-4C, respectively.
FIG. 6 shows other examples of character patterns.
FIG. 7 shows a table of the run length frequency distribution of the character patterns shown in FIG. 6.
FIG. 8 shows an exemplary code table prepared on the basis of the frequency distribution of FIG. 7.

FIGS. 5A-5C show examples of compression code tables 51-53 used with the present invention. The tables 51-53 are compression code tables derived from the tables 45-47, respectively, using the known method described in the above-noted publication in such a manner that high compressibility can be achieved for each data. Here, for example, when the table 51 is used to compress the data corresponding to the table 46, i.e. character patterns 31 and 32, a total of 32 bits are required to represent the results, but when the table 52 is used for the same data, only 16 bits are required. In fact, besides those bits, some additional bits are required, for example, a code representing the end of a row, and a code representing the color at the beginning of a row. Further, in actual applications, it is better to make a premise that each row of a compressed character pattern should necessarily begin with a code representing a white picture element. A row beginning with a black picture element, for example, the first and second rows of the character patterns 34, should be given an imaginary, actually not existing and therefore zero in number, white picture element at the beginning thereof before it will be compression-coded. On such a premise, the pattern 36, for example, comprises white "0" and black "6" in the first and uppermost row, white "0", black "1", white "4" and black "1" in the second row, and white "3", black "2" and white "1" in the third row.

The table 48 of FIG. 7 shows the run length frequency distribution of the three character patterns shown in FIG. 6, in which it is premised that each row begins with a white picture element. It shows that there is no black "0", and there are twelve white "0". The table 54 shows an example of a set of run codes prepared from the above-mentioned table 48. Here, shorter codes are assigned to those runs which frequently occur in the table 48, so that the quantity of data obtained by the compression is less. For example, in the table 48, the frequency of black "2" is a high value of 10, so that a short code "1" is assigned to black "2". See the table 54.

Figure 9:
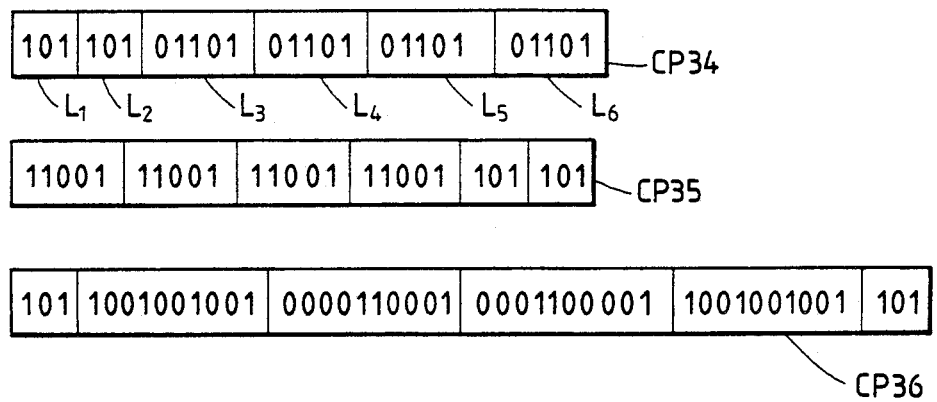
FIG. 9 shows examples of compressed character patterns.

The patterns 34-36 can be converted into the compressed data CP34-CP36, respectively, shown in FIG. 9 by compression-coding them using said table 54. For example, the pattern CP34 is coded as follows: white "0" and black "6" of the first line L1 are coded into "1" and "01", respectively; white "0" and black "6" of the second line L2 are coded into "1" and "01", respectively; white "2", black "2" and white "2" of the third line L3 are coded into "01", ¢1" and "01", respectively.

For the reasons described above, the present invention provides that a plurality of code tables adapted for different types of characters should be prepared and stored in a character pattern file. Code tables stored in the regions 14A, 14B and 14C are prepared for restoring different sets of character patterns of different sizes or styles, and are used for compressed character patterns stored in the regions 15A, 15B and 15C.

Figure 10:
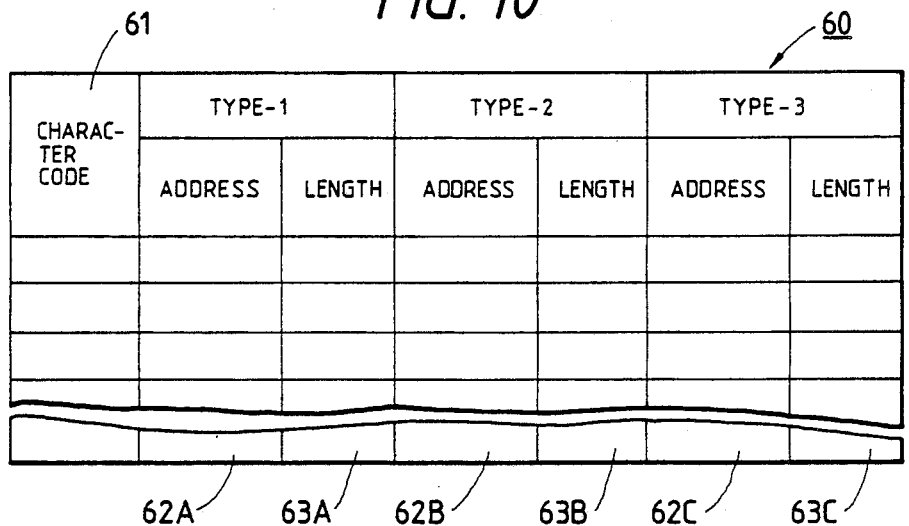
FIG. 10 shows the construction of the management table used for the first embodiment of the present invention.

FIG. 10 shows an example of the management table 60 stored in a region 13 of the file 20. This table 60 manages the compressed character pattern storage addresses 62A, 62B and 62C in the first type, second type and third type character pattern files 15A, 15B and 15C, respectively, for each character code 61, and the data lengths 63A, 63B and 63C of the first type, second type and third type character patterns, respectively, for each character code 61. Specifically, each address consists of, for example, the head number of the disk which forms the storage medium for the file, cylinder number, sector number and the number of the bytes from the beginning byte within the sector. The data length is represented by, for example, the combination of the number of bytes and the number of fractional bits.

Figure 11:
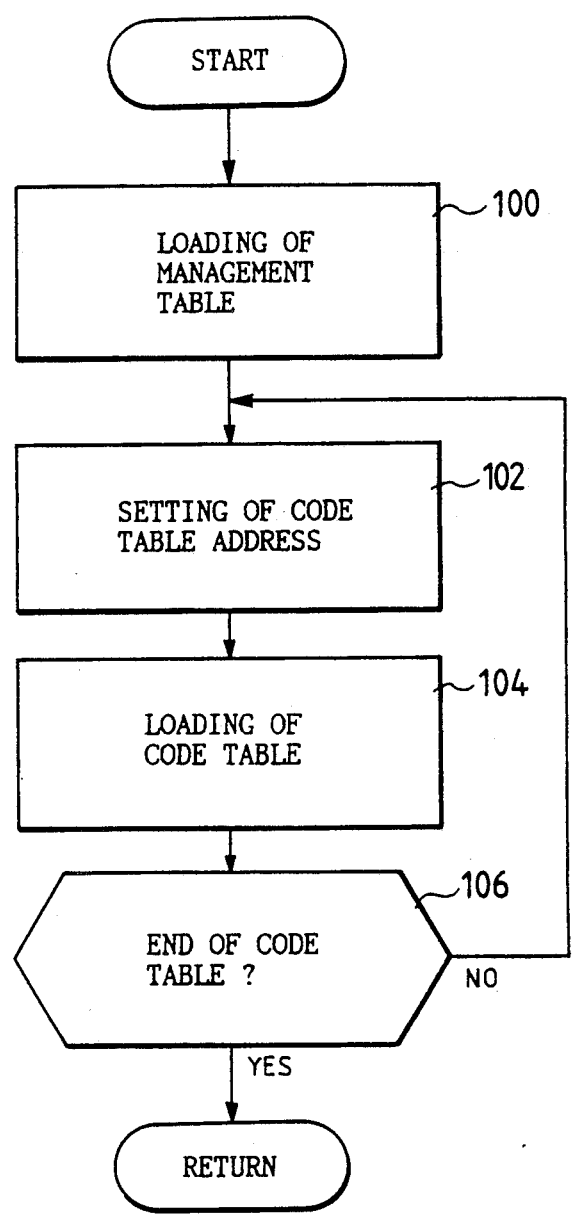
FIG. 11 shows a flow chart of a table loading routine.

Next, the table loading routine performed by the system of FIG. 1 upon energization thereof will be described with reference to the flow chart of Fig. 11.

Upon energization of the system, the management table 60 is read from the region 13 of the compressed character pattern file 20 and is loaded into the memory 8 (step 100). Next, the address in the memory region 9A where the code table 14A is to be stored is set (step 102), and the code table 14A read from the compressed character pattern file 20 is loaded there (step 104). Similar operations are repeated to load all the code tables 14A-14C into the memory regions 9A-9C.

Figure 12:
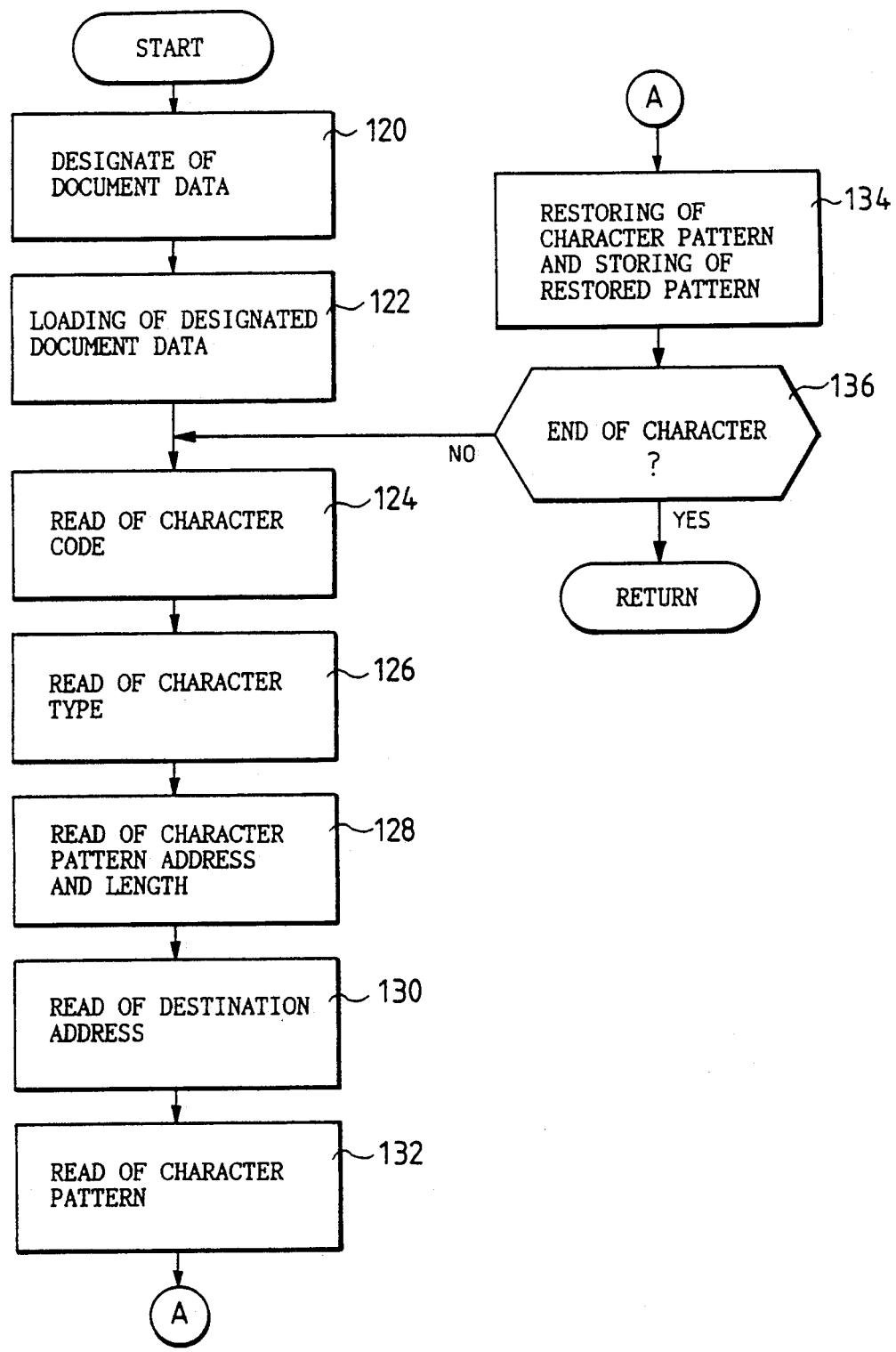
FIG. 12 shows a flow chart of the routine of restoring character patterns in the first embodiment.

Next, as an example of the character pattern expanding process in the present system, document data retrieving operations will be explained with reference to the flow chart of FIG. 12. Firstly, document data to be retrieved is designated through the keyboard 5 (step 120), and the document file 12 is searched and the designated document data is loaded into the memory 7A (step 122). In step 124 the character code of the first character of the document data is read, and in step 126 the size and style of such character is read. The management table 60 already stored in the memory 8 is consulted on the basis of such character code and character type to obtain the address 62 and the length 63 of the compressed character pattern to be read (step 128). In step 130, the document data in the memory 7A is consulted to obtain the address in the memory 7B where the character is spread. In step 132, the compressed character pattern corresponding to the above-mentioned character code is read from the compressed character pattern file 20 on the basis of the above-mentioned address 62 and the data length 63. In step 134, the character pattern is restored by the spreading or expansion processor 3A and spread in the memory 7B. The restoring process comprises: sequentially searching the bit train of the above-mentioned compressed character pattern on the code table which is determined by the character pattern type obtained in step 126 and the address used in step 102, and writing black or white picture elements of the run length derived by the searching onto the prescribed location on the memory 7B.

The restoring process is performed by the spreading processor 3A in the above-described embodiment. Alternatively, it may also be performed by the processor 4. Meanwhile, each character pattern type is uniquely associated with a corresponding code table in the compressed character pattern file 20. Alternatively, a code table may also be used commonly for two or more character types, such as a larger but thinner-lined character type and a smaller but thicker-lined character type. Further, the characters of the same type may also be sorted into several character groups according to the number of strokes, and different code tables may be applied to different character groups. Further, character patterns are stored in files in the above-described embodiment, but character patterns may also be stored in a memory such as a ROM.

A description will be given below of another embodiment of the present invention, in which compressed character pattern data of each character type can be stored in a fixed length format.

Figure 13:
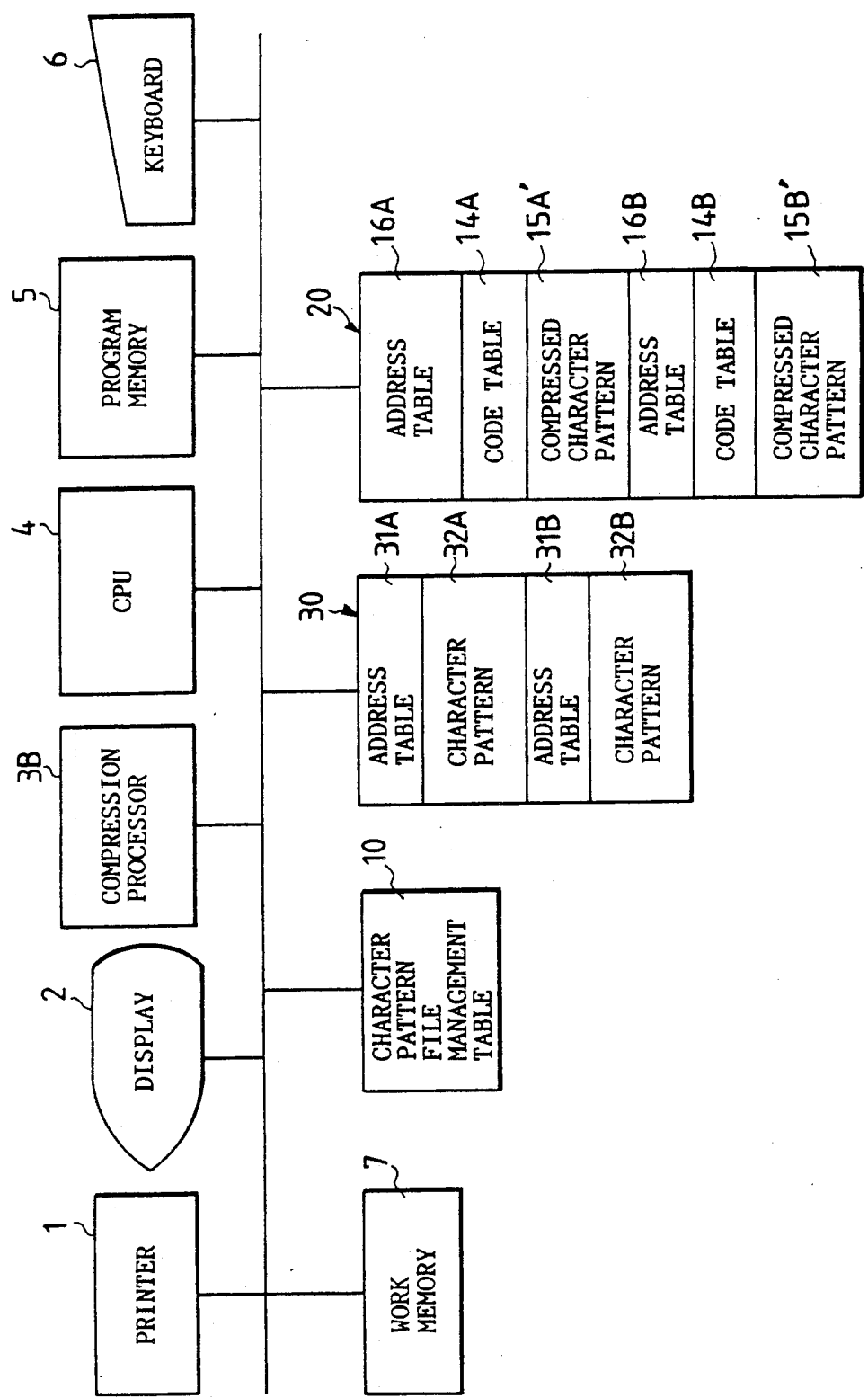
FIG. 13 is a block diagram showing a system for implementing a second embodiment of the present invention.

FIG. 13 is a block diagram showing the construction of the system which compresses data into a fixed length form. 3B denotes a compression processor for converting character pattern data into compressed data in accordance with code tables; 30 designates an original character pattern file in which character patterns of plural types are stored in pre-compression form; 10 designates a memory for storing therein a character pattern file management table indicating which type of character patterns are stored in which file; 20 designates a file for storing therein compressed character patterns; the other elements are the same as those shown in FIG. 1.

The original character pattern file 30 has an address table 31A (31B) and a character pattern region 32A (32B) for each character type. In the character pattern region 32A, character patterns are stored; in the case of the characters 34, 35, 36 of the size of 6×6 picture elements shown in FIG. 6, they are stored in dot patterns P34, P35, P36, respectively, as shown in FIG. 14.

In accordance with the present invention, a code table 14A is prepared for each character type on the basis of the data in each of the above-mentioned character pattern regions 32A (32B).

Figure 17:
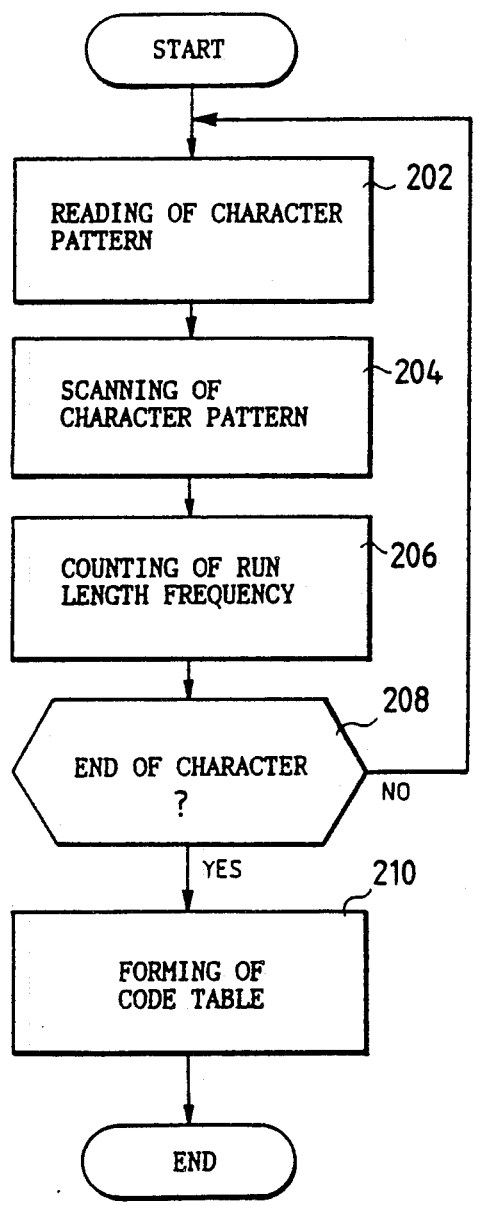
FIG. 17 shows a flow chart of a program for deriving a run length frequency distribution.

To prepare the code tables, as shown in FIG. 17, original character pattern data is read, one character after another, from the character pattern region 32A (step 202); each row of the character pattern is then scanned (step 204); the frequency of occurrence of each run length is summed up (step 206). This process is repeated for all the character patterns in the character pattern region 32A and after the completion of this process (step 208), codes are assigned to the runs in the run frequency distribution table (see FIG. 7), shorter codes to more frequently occurring runs, to prepare the code table 14A (see FIG. 8; step 210).

The data obtained by compression-coding character patterns using the above-described character tables are of various lengths. In the case of variable length data, the character pattern management table must include starting addresses and lengths of data together with character codes, thus complicating data management. If data can be held in fixed length formats, then data addresses of character patterns can be easily found by simple calculations using character codes so that the data management is much easier.

Figure 18:
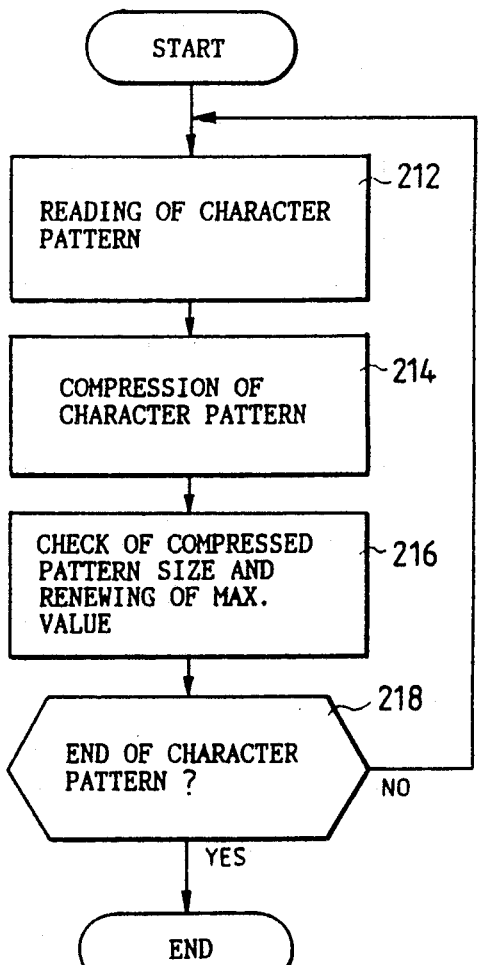
FIG. 18 shows a flow chart of a process for determining the maximum of data lengths of compressed character patterns.

Thus, in accordance with present invention, each character pattern in the character pattern region 32A is compression-coded using the above-mentioned code table 14A and the maximum value of the compression-code data is derived, as shown in the flow chart of FIG. 18. Specifically, original character patterns are read from the character pattern region 32A (step 212) and compression-coded (step 214); the data length of each compression-coded character pattern is compared with the current maximum data length and necessary updating is done and the updated maximum data length is stored (step 216). Such operations are repeated for all the character patterns in the region 32A to derive the maximum data length MAX of the compressed character patterns associated with the above-mentioned code table (step 218).

In accordance with the present invention, all the compressed character pattern lengths are adjusted to the above-mentioned length MAX and are stored in the file 20. Specifically, as shown in the flow chart of FIG. 19, original character patterns are read, one after another, from the character pattern file region 32A (step 311); they are compression-coded in accordance with the code table 14A (step 312); they are then stored in the compressed character pattern region 15A' of the file 20 in the form of compressed data records of the fixed length MAX (step 313). If a compressed data is of a shorter length than the MAX, fill bits are added to its end. For example, if the MAX is 50 bits, the compressed character patterns CP34 and CP35 of 26 bits shown in FIG. 9 are given 24 fill bits, and another compressed character pattern CP36 of 46 bits is given 4 fill bits; they are thus adjusted to fixed length records.

The above-described pattern compressing process is repeated for all the character patterns in the file region 32A (step 314).

Figure 19:
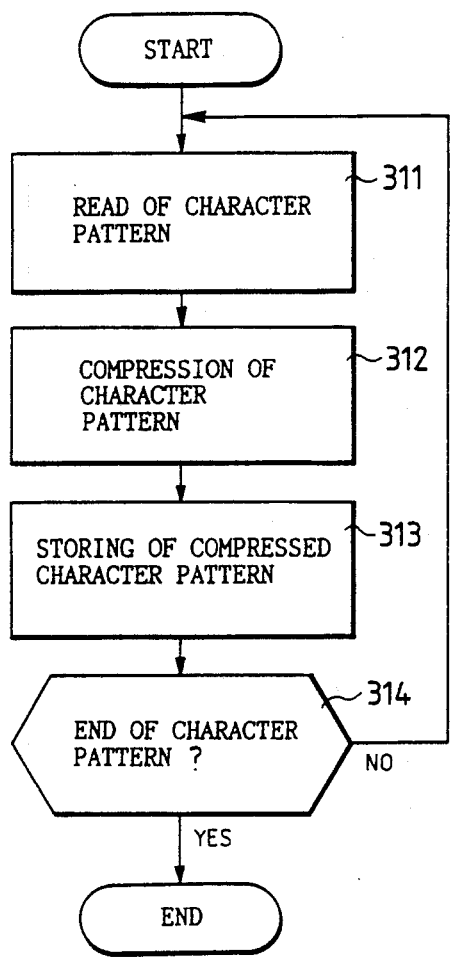
FIG. 19 shows a flow chart of a process for converting original character patterns into fixed length compressed character patterns.

Another code table 14B and another set of compressed character patterns 15B can be obtained within the file 20 by performing the above-mentioned operations of FIGS. 17–19 to the character patterns in the file region 32B.

The address table 16A (16B) has stored therein the address of the code table 14A, the starting address of the compressed character pattern file 15A' (15B') and the record length of each compressed character pattern.

In the case of fixed length compressed character patterns, the storage capacities of the file regions 15A' and 15B' are determined by the data length MAX and the number of characters. Therefore, in order to reduce the storage capacities, the maximum data length MAX of the compressed character patterns should be reduced. One way to reduce the MAX is to analyze the run length frequency distribution of the longest compressed character data and modify the code table so as to reduce such compressed character data. For example, the patterns 34, 35 and 36 are compression-coded into 26, 26 and 46 bits data, respectively, as shown in FIG. 9, when the table 54 of FIG. 8 is applied. In this case, the record length MAX for fixed length recording is 46 bits. Now, the pattern 36 of the largest data length has a run length frequency distribution in which relatively high frequencies are of black 1 (four), white 1 (two) and white 3 (two). To shorten the codes for these runs, the frequencies of the black 1, white 1 and white 3 are emphasized in the frequency distribution table 48 of FIG. 7 by adding a number of 10, for example, to each of these frequencies. The thus modified frequency distribution table 48' is shown in FIG. 15. Also, a code table 54' is shown in FIG. 16, which is obtained by assigning shorter codes to more frequently occurring runs on the basis of the modified frequency distribution table 48'.

When the code table 54' is applied for compression-coding the patterns 34, 35 and 36, they are coded into "42", "42" and "38" bit data, respectively. Therefore, the record length required for fixed length recording is 42 bits, and thus a higher compressibility is achieved. Thus, compressibility can be increased even in the case of the fixed length recording, by repetitively renewing the code tables in such a manner that the largest compressed data can be shortened.

Figure 21:
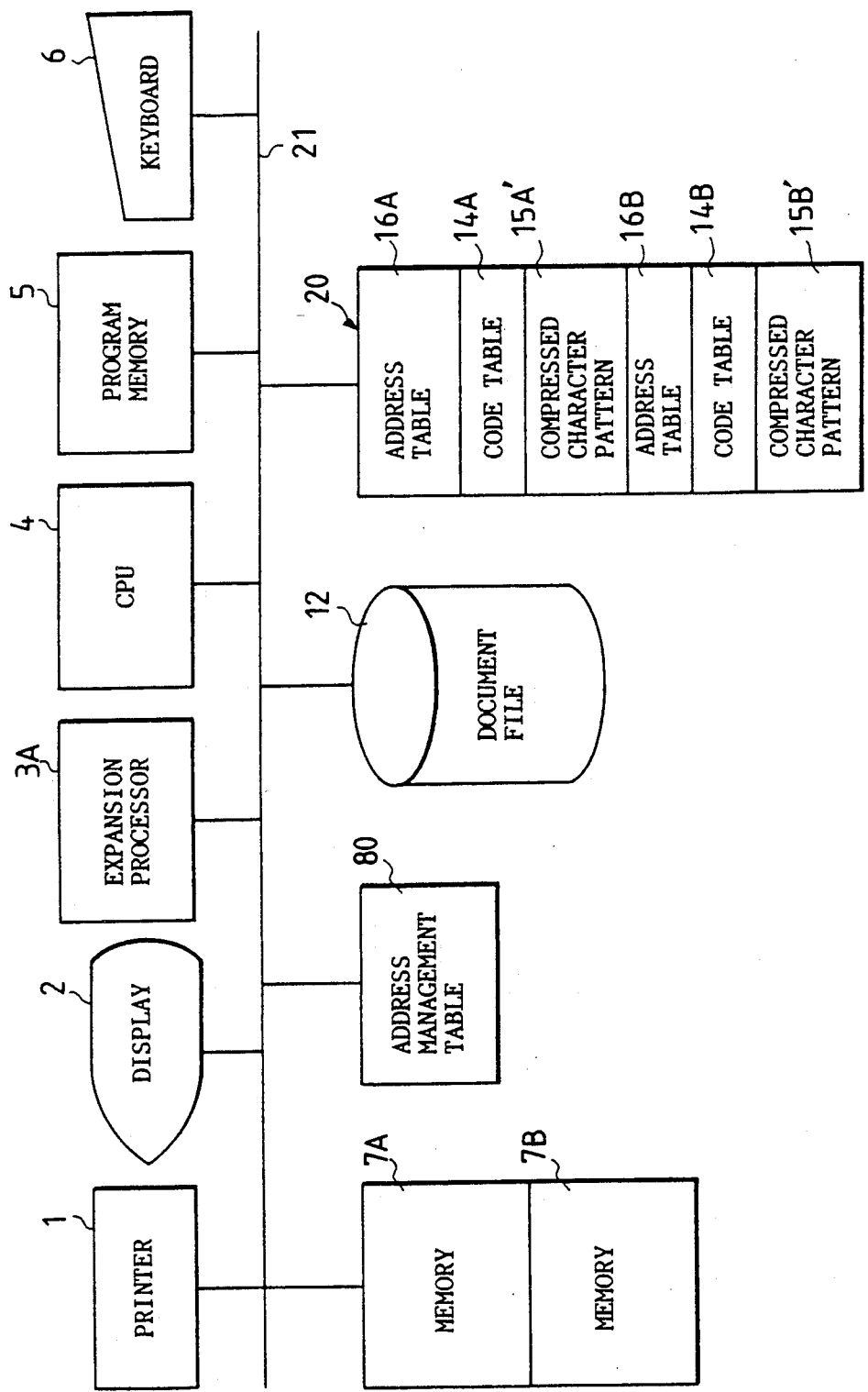
FIG. 21 shows the construction of a document processing system which operates in accordance with the flow chart of FIG. 20.

Now, a document processing system using the above-described fixed length compressed character patterns will be described. FIG. 21 is a block diagram showing the general construction of the document processing system, which is similar to the system of FIG. 1.

In this embodiment, the address management table 80 consists of, for example, character types 81 (FIG. 22), compressed character pattern data lengths (fixed lengths) 82, starting addresses of character pattern file regions 83, and addresses of code tables 84, as shown in FIG. 22. The address tables 16A and 16B are consulted to prepare this table.

Figure 20:
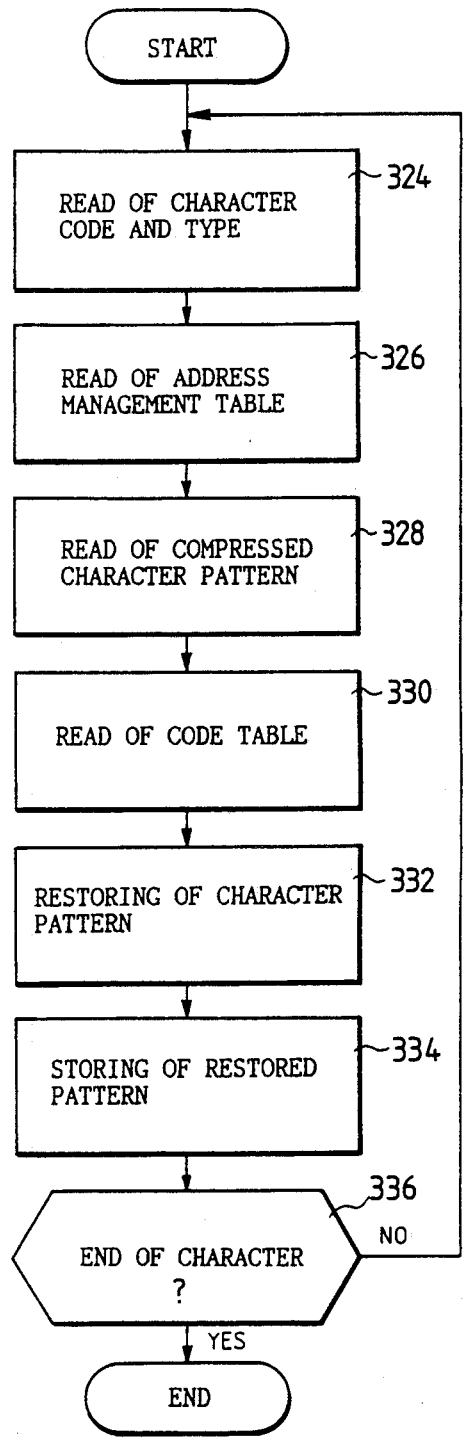
FIG. 20 shows a flow chart of a process of spreading character patterns using fixed length compressed character patterns.

The conversion of compressed character patterns into character patterns is performed along the flow chart of FIG. 20. It is assumed that characters in a document read from the document file 12 into the memory 7A are converted into character patterns which are spread on the memory 7B.

Firstly, the character code C and character type i of each character to be converted are read from the memory 7A (step 324). Subsequently, the address management table 80 is consulted to obtain the data length li corresponding to the character type i, the starting address Si of the compressed character pattern file region, and the address Ti of the code table (step 326). The sum of the product of the character code C and the data length li and the starting address Si of the file region is the storage address Ai of the compressed character pattern of the above-described character to be converted. Based on such address, the compressed character pattern (the data length is li) is read from the file 20 (step 328). Next, the code table is read from the file 20 at address Ti (step 330); the above-described compressed character pattern is restored using such code table (step 332). The thus restored character pattern is spread on the memory 7B (step 334) The above-described steps are repeated for all the characters in the memory 7A which are to be converted (step 336)

As will be understood from the above description, the present embodiment allows to store character pattern data in fixed length formats. Therefore, the management table required for storing character pattern data may be simple, so that complicated data management, such as that which is required for variable length recording, is not necessitated. Moreover, compressibility can further be increased even in the case of fixed length recording, by reducing the record length required for storage.

What is claimed is:

1. A character pattern utilization system provided with a plurality of different types of character patterns for each of a plurality of character, each character having a corresponding character code, said system comprising:

a plurality of code table means for defining particular coding rules corresponding to the character pattern types;

pattern file means having a plurality of file areas each of which corresponds to a character pattern type and has stored therein a set of compressed character patterns obtained by encoding a set of original character patterns according to one of said coding rules which corresponds to the character pattern type of said original character patterns; and reading and restoring means for reading from said pattern file means, upon designation of a character code and a character pattern type, a compressed character pattern of said designated character pattern type corresponding to the designated character code, and for restoring the compressed character pattern to an original character pattern according to a coding rule defined in one of said code table means which corresponds to said designated character pattern type.

2. The character pattern utilization system according to claim 1, further comprising:

management table means for defining relationships among character codes, character pattern types and addresses of compressed character patterns stored in said pattern file means to be accessed; and wherein said reading and restoring means refers to said management table to access one of said plurality of file areas.

3. The character pattern utilization system according to claim 1, wherein:

each of said compressed character patterns in a same file area is of a fixed length which is determined depending upon a character pattern type to which it belongs.

4. The character pattern utilization system according to claim 1, wherein:

each of said code table means defines respective correspondence of run lengths of black picture elements and of white picture elements with codes;

said file means having stored therein each compressed character pattern in a form of a combination of said codes.

5. A method of storing at least two groups of compressed character patterns in a memory means, comprising:

a first step of converting a first group of original character patterns belonging to a first character type to a first group of individually compressed character pattern records by coding in accordance with a first predetermined coding rule while obtaining a maximum record length among said compressed character pattern records;

a second step of converting said first group of said original character patterns to a group of individually compressed character pattern records in accordance with said first predetermined coding rule, while adjusting each record length to the maximum length and storing said compressed character pattern record thus obtained in said memory means; and, repeating said first and second steps for a second group of original character patterns belonging to a second character type by applying a second coding rule different from said first predetermined coding rule.

6. The method of storing compressed character patterns according to claim 5, further comprising the steps of:

analyzing a number of said plural original patterns to detect features common to the original character patterns belonging to said group; and preparing a coding rule in accordance with said features, said first and second steps being carried out by applying said coding rules as said predetermined coding rule.

7. The method of storing compressed character patterns according to claim 6, further comprising;

a step of modifying said predetermined coding rule after said first step so as to shorten said maximum length in accordance with features of an original character pattern which, in the compressed form thereof, has said maximum record length;

each of said original character patterns being coded in said second step in accordance with said modified coding rule and stored in said memory means in the form of fixed length record of said shortened maximum length.

8. A method of storing a group of compressed character patterns in a memory means, comprising:

a first step of converting a group of original character patterns belonging to one character type to a group of individually compressed character pattern records by coding in accordance with a predetermined coding rule while obtaining a maximum record length among said compressed character pattern records;

a second step of converting the group of said original character patterns to a group of individually compressed character pattern records in accordance with said predetermined coding rule, while adjusting each record length to the maximum length and storing all said records in said memory means in a predetermined record size;

a third step of analyzing a number of said plural original patterns to detect features common to the original character patterns belonging to said group; and, a fourth step of preparing a coding rule in accordance with said features, said first and second steps being carried out by applying said coding rule as said predetermined coding rule.

9. The method of storing compressed character patterns according to claim 8, further comprising:

the step of modifying said predetermined coding rule after said first step so as to shorten said maximum length in accordance with features of an original character pattern which, in the compressed form thereof, has said maximum record length;

each of said original character patterns being coded in said second step in accordance with said modified coding rule and stored in said memory means in the form of fixed length record of said shortened maximum length.

* * * * *